(12) United States Patent
Kim et al.

(10) Patent No.: US 10,615,373 B2
(45) Date of Patent: Apr. 7, 2020

(54) SUBSTRATE

(71) Applicant: LG CHEM, LTD., Seoul (KR)

(72) Inventors: Yong Nam Kim, Daejeon (KR); Eun Byurl Cho, Daejeon (KR); Yeon Keun Lee, Daejeon (KR); Mun Kyu Joo, Daejeon (KR); Jong Seok Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/080,587

(22) PCT Filed: May 23, 2017

(86) PCT No.: PCT/KR2017/005353
§ 371 (c)(1),
(2) Date: Aug. 28, 2018

(87) PCT Pub. No.: WO2017/204533
PCT Pub. Date: Nov. 30, 2017

(65) Prior Publication Data
US 2019/0036083 A1 Jan. 31, 2019

(30) Foreign Application Priority Data

May 23, 2016 (KR) .......... 10-2016-0062885
May 23, 2017 (KR) .......... 10-2017-0063554

(51) Int. Cl.
*H01L 51/52* (2006.01)
*H01L 51/00* (2006.01)

(52) U.S. Cl.
CPC ...... *H01L 51/5268* (2013.01); *H01L 51/5275* (2013.01); *H01L 51/0096* (2013.01);
(Continued)

(58) Field of Classification Search
None
See application file for complete search history.

(56) References Cited

U.S. PATENT DOCUMENTS 7,462,984 B2 12/2008 Handa et al.
9,366,787 B2 6/2016 Lu
(Continued)

FOREIGN PATENT DOCUMENTS

CN 1759637 A 4/2006
CN 103207523 A 7/2013
(Continued)

OTHER PUBLICATIONS

Search Report and Written Opinion issued in PCT/KR2017/005353 dated Aug. 25, 2017, 8 pages.
(Continued)

*Primary Examiner* — Asok K Sarkar
(74) *Attorney, Agent, or Firm* — Rothwell, Figg, Ernst & Manbeck, P.C.

(57) ABSTRACT

The present application provides a substrate, an organic electronic device and a use thereof. The substrate of the present application has a structure comprising an electrode layer directly formed on the corrugated surface of the optical functional layer, and upon having formed an organic electronic device, can secure excellent functionality, for example, light extraction efficiency, and the like, together with stable drive of the element for a long time.

16 Claims, 1 Drawing Sheet

(52) U.S. Cl.
CPC .. *H01L 2251/303* (2013.01); *H01L 2251/308* (2013.01); *H01L 2251/558* (2013.01)

(56) References Cited

U.S. PATENT DOCUMENTS

| | | | |
|---|---|---|---|
| 2003/0071794 A1 | 4/2003 | Krakawa et al. | |
| 2009/0066220 A1* | 3/2009 | Handa | H01L 51/5268 |
| | | | 313/503 |
| 2010/0060142 A1* | 3/2010 | Itou | B82Y 20/00 |
| | | | 313/498 |
| 2012/0155093 A1 | 6/2012 | Yamada et al. | |
| 2017/0352841 A1* | 12/2017 | Lee | H01L 51/56 |
| 2018/0026168 A1* | 1/2018 | Lenef | H01L 25/0753 |
| | | | 257/91 |

FOREIGN PATENT DOCUMENTS

| | | |
|---|---|---|
| CN | 105122491 A | 12/2015 |
| JP | H08-176293 A | 7/1996 |
| JP | 2012-069920 A | 4/2012 |
| JP | 2013-114802 A | 6/2013 |
| JP | 2014-197530 A | 10/2014 |
| JP | 2016-510942 A | 4/2016 |
| KR | 10-2003-011625 A | 2/2003 |
| KR | 10-2005-0111348 A | 11/2005 |
| KR | 10-2007-0048217 A | 5/2007 |
| KR | 10-2010-0051631 A | 5/2010 |
| KR | 10-2013-0084251 A | 7/2013 |
| KR | 10-2015-0119138 A | 10/2015 |
| KR | 10-2015-0140670 A | 12/2015 |

OTHER PUBLICATIONS

Office Action issued in Korean Patent Application No. 10-2017-0063554 dated Apr. 18, 2018, 5 pages.

* cited by examiner

SUBSTRATE

CROSS-REFERENCE TO RELATED APPLICATIONS

The present application is a 35 U.S.C. § 371 National Phase Entry Application from PCT/KR2017/005353, filed on May 23, 2017, and designating the United States, which claims the benefit of priority based on Korean Patent Application No. 10-2016-0062885 filed on May 23, 2016 and Korean Patent Application No. 10-2017-0063554 filed on May 23, 2017, the disclosures of which are incorporated herein by reference in their entirety.

TECHNICAL FIELD

The present application relates to a substrate, an organic electronic device, a light source and a lighting apparatus.

BACKGROUND ART

An organic electronic device (OED) is, for example, an element comprising at least one layer of an organic material capable of carrying an electric current, as disclosed in Japanese Laid-open Patent Publication No. H8-176293. As a kind of the organic electronic device, an organic light emitting device (OLED), an organic solar cell, an organic photoconductor (OPC) or an organic transistor, and the like is included.

The organic light emitting device, which is a typical organic electronic device, usually comprises a substrate, a first electrode layer, an organic layer and a second electrode layer sequentially. In a structure referred to as a so-called bottom emitting device, the first electrode layer may be formed of a transparent electrode layer, and the second electrode layer may be formed of a reflective electrode layer. Furthermore, in a structure referred to as a so-called top emitting device, the first electrode layer is formed of a reflective electrode layer, and the second electrode layer is also formed of a transparent electrode layer. Electrons and holes injected by the electrode layer can be recombined in a light emitting layer existing in the organic layer to generate light. Light can be emitted toward the substrate in the bottom emitting device and toward the second electrode layer in the top emitting device.

DISCLOSURE

Technical Problem

The present application provides a substrate, an organic electronic device, a light source, and a lighting apparatus.

Technical Solution

The substrate of the present application comprises a support base layer, an optical functional layer and an electrode layer, which are sequentially formed.

In the substrate of the present application, the optical functional layer may be a layer having a corrugated surface and may be a layer comprising scattering particles. The electrode layer in the substrate may be formed directly on the corrugated surface of the optical functional layer.

Figure 1:
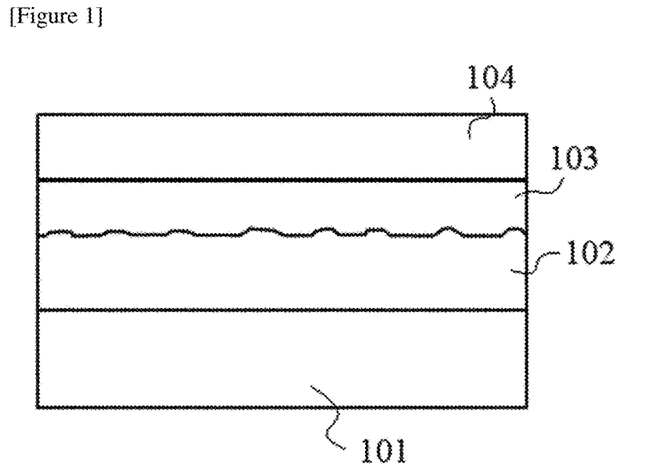

FIG. 1 is an exemplary diagram of a case in which an organic electronic device (104) is formed on a substrate comprising a support base material (101), an optical functional layer (102) and an electrode layer (103) sequentially.

The optical functional layer may have the corrugated surface on the surface opposite to the support base layer, where the corrugated surface may be a corrugated surface having an average roughness (Ra) of 5 nm or more and a 10-point average roughness (Rz) of 30 nm or more. At this time, the electrode layer may be formed directly on the corrugated surface in contact with the corrugated surface.

In another example, the average roughness (Ra) of the corrugated surface may be about 5.5 nm or more, 6 nm or more, 6.5 nm or more, 7 nm or more, 7.5 nm or more, 8 nm or more, 8.5 nm or more, 9 nm or more, or 9.5 nm or more. Also, in another example, the 10-point average roughness (Rz) may be 35 nm or more, 40 nm or more, 45 nm or more, 50 nm or more, 55 nm or more, 60 nm or more, 65 nm or more, 70 nm or more, or 75 nm or more. The upper limit of the average roughness (Ra) and the 10-point average roughness (Rz) is not particularly limited, and can be adjusted in consideration of drive stability of the device. In one example, the average roughness (Ra) may be about 20 nm or less, 19 nm or less, 18 nm or less, 17 nm or less, 16 nm or less, 15 nm or less, 14 nm or less, 13 nm or less, 12 nm or less, 11 nm or less, or 10 nm or less. Also, the 10-point average roughness (Rz) may be about 100 nm or less, 95 nm or less, 90 nm or less, or 85 nm or less.

The manner of controlling the roughness of the corrugated surface within the above range is not particularly limited and can be controlled through, for example, the thickness of the optical functional layer and/or the particle diameter of particles contained in the corresponding layer.

In the prior art, there is also an example in which the optical functional layer is formed between the electrode layer and the support base layer using scattering particles, to improve efficiency for example, light extraction efficiency of the organic electronic device. However, when the scattering particles are used, irregularities are formed on the surface, and when the electrode layer is formed on the corrugated surface, the element is not stably driven, so that once a so-called flat layer has been formed on the corrugated surface and then the electrode layer has been formed thereon. However, the inventors of the present invention have found out that it is possible to form a substrate maximizing the light extraction efficiency while enabling stable driving without a flat layer, by controlling the corrugated surface appropriately and, if necessary, controlling the structure of the optical functional layer.

That is, in the substrate of the present application, the optical functional layer and the electrode layer are formed in contact with each other, and there is no flat surface therebetween.

Here, the average roughness (Ra) is a value calculated by Equation A below, as well known and the 10-point average roughness (Rz) is an average roughness of 5 highest points and 5 lowest points identified on the corrugated profile.

$$R_a = \frac{1}{N}\left(\sum_{i=1}^{N} |Z_i|\right) \quad \text{[Equation A]}$$

In Equation A, Ra is an average roughness, N is a number of data points of the array in the horizontal direction, and Z is a height of each data point relative to the reference mean plane.

The average roughness (Ra) and the 10-point average roughness (Rz) can be measured using a 3D optical profiler, which is a general measuring instrument.

The type of support base layer applied to the substrate of the present application is not particularly limited and a known base layer may be used. For example, as the support base layer, for example, a glass substrate or a polymer film, and the like can be used. Here, as the glass substrate, a soda lime glass substrate, a barium/strontium-containing glass substrate, a lead glass substrate, an aluminosilicate glass substrate, a borosilicate glass substrate, a barium borosilicate glass substrate or a quartz substrate, and the like may be used. An example of the polymer film can be exemplified by a PI (polyimide) film, a PEN (polyethylene naphthalate) film, a PC (polycarbonate) film, an acrylic resin film, a PET (poly (ethylene terephthalate)) film, a PES (poly (ether sulfide)) film, a PEI (polyetherimide) film, a PPS (polyphenylene sulfide) film, a COC (cyclic olefin copolymer) film, a PEEK (polyetheretherketone) film or a PS (polysulfone) film, and the like, but is not limited thereto.

As the support base layer, a light transmissive base layer can be used. In this specification, the term light transmissive film may mean a film having a transmittance of at least 50%, at least 60%, at least 70%, at least 80% or at least 90% for any one of light in a visible light range (within a wavelength range of about 400 nm to 700 nm) or light in the entire visible light range, for example.

If necessary, on the surface of the support base layer and the like, a reflective layer may be formed using a reflective material such as aluminum, and the support base layer may also be a TFT (Thin Film Transistor) support base layer in which a drive TFT is present.

The support base layer may have a refractive index of at least about 1.4, at least about 1.45, at least about 1.5, at least about 1.6, at least about 1.7, at least about 1.75, or at least about 1.8. The term refractive index herein is a refractive index measured for light having a wavelength of about 550 nm, unless otherwise specified. The range of the refractive index of the support base layer in the organic light emitting device may be advantageous for increasing the light efficiency of the device. The upper limit of the refractive index of the support base layer is not particularly limited. For example, the support base layer may have a refractive index of about 2.0 or less, about 1.9 or less, about 1.8 or less, or about 1.7 or less or so.

The thickness of the support base layer is not particularly limited and may be selected within an appropriate range in consideration of desired performances, for example, flexibility, light extraction efficiency, or barrier property. For example, the support base layer may have a thickness in a range of about 10 μm to about 125 μm, or in a range of about 20 μm to about 60 μm.

An optical functional layer is formed on the support base layer. As the optical functional layer, any kind of layer can also be used, which can contribute to the functional improvement of elements such as organic electronic devices by exhibiting at least one optical function on the support base layer.

Such an optical functional layer has the corrugated surface as described above.

As one example of the optical functional layer, a light-scattering layer can be exemplified. In the present application, the term light-scattering layer may mean, for example, all kinds of layers formed so that by scattering, refracting or diffracting light incident on the layer, it can be resolved or relaxed for the incident light to be trapped at the interlayer interface. The embodiment of the light-scattering layer is not particularly limited as long as the light-scattering layer is realized to exhibit the above function.

The optical functional layer may have a haze of about 20% or more. The haze of the optical functional layer may be 25% or more, 30% or more, 35% or more, 40% or more, 45% or more, 50% or more, or 55% or more. The haze may be, for example, about 90% or less, 85% or less, 80% or less, 75% or less, 70% or less, or 65% or less.

The haze may be a result of evaluation by the JIS K 7105 method using HM-150.

The optical functional layer, for example, the light-scattering layer may be a layer comprising scattering particles, and may be a layer comprising, for example, a matrix material and scattering particles. In this specification, the term "scattering particles" may mean particles having the refractive index different from those of surrounding materials such as, for example, the matrix material, and also having an appropriate size so that the incident light can be scattered, refracted or diffracted. The refractive index of the scattering particles may have a difference in the refractive index of the surrounding material, for example, the matrix material, of more than 0.3 or 0.3 or more. The refractive index difference may be about 0.35 or more, about 0.4 or more, about 0.5 or more, about 0.55 or more, about 0.6 or more, about 0.65 or more, about 0.7 or more, about 0.75 or more, about 0.8 or more, or about 0.85 or more. The upper limit of the refractive index difference is not particularly limited, but may be, for example, about 1.5 or less or about 1.3 or less. For example, the scattering particles may have a refractive index of about 1.0 to 3.5 or about 1.0 to 3.0 or so. The refractive index of the scattering particles may be, for example, 1.0 or more, 1.5 or more, or 2.0 or more, and also about 3.5 or less, about 3.0 or less, or about 2.8 or less. The scattering particles may be, for example, an average particle diameter of 50 nm or more, 100 nm or more, 150 nm or more, or 200 nm or more. The average particle diameter of the scattering particles may be, for example, 10,000 nm or less, 9,000 nm or less, 8,000 nm or less, 7,000 nm or less, 6,000 nm or less, 5,000 nm or less, 4,000 nm or less, 3,000 nm or less, 2,000 nm or less, 1,000 nm or less, 900 nm or less, 800 nm or less, 700 nm or less, 600 nm or less, 500 nm or less, 400 nm or less or 300 nm or less.

The scattering particles may have a shape such as a spherical, elliptical, polyhedral, or amorphous shape, but the shape is not particularly limited. As the scattering particles, particles comprising organic materials such as polystyrene or a derivative thereof, an acrylic resin or a derivative thereof, a silicone resin or a derivative thereof, or a novolak resin or a derivative thereof, or inorganic materials such as silica, alumina, titanium oxide or zirconium oxide, and the like can be exemplified. The scattering particles may be formed by comprising only one material of the above materials, or two or more materials of the above materials.

The ratio of the scattering particles in the optical functional layer is not particularly limited and may be selected within a range capable of exhibiting the aforementioned haze, for example.

The light-scattering layer may further comprise a matrix material that retains scattering particles. The matrix material can be formed using a material having a refractive index similar to that of another adjacent material such as the support base layer or a material having a higher refractive index than that.

The matrix material may comprise at least a binder. As the binder, for example, a material having a refractive index in the range of 1.4 to 1.65 may be used. In another example, the binder may have a refractive index of about 1.45 or more, and 1.6 or less, or 1.55 or less.

As the binder, for example, a heat- or photo-curable monomeric, oligomeric or polymeric organic material of polyimide, a caldo resin having a fluorene ring, urethane, epoxide, polyester or (meth)arylate series, or an inorganic material such as silicon oxide, silicon nitride, silicon oxynitride or polysiloxane or an organic-inorganic composite, and the like can be used.

The matrix material may comprise, as the binder, polysiloxane, polyamic acid or polyimide. Here, the polysiloxane may be formed by polycondensation of, for example, a condensation silane compound or siloxane oligomer, and the like and may form a matrix material based on bonds of silicon and oxygen (Si—O). The polysiloxane may be based on only siloxane bonds (Si—O), or may also retain an organic group such as an alkyl group or a condensation functional group such as an alkoxy group partially, by controlling the condensation conditions or the like in the process of forming the matrix material.

As the polyamic acid or polyimide, for example, a highly refractive polyamic acid or polyimide having a refractive index of about 1.5 or more or about 1.6 or more with respect to light having a wavelength of 633 nm can be used. Such a highly refractive polyamic acid or polyimide can be produced, for example, by using a monomer into which a halogen atom other than fluorine, a sulfur atom or a phosphorus atom, and the like is introduced. For example, polyamic acid capable of improving dispersion stability of particles by having a site capable of bonding with particles, such as a carboxyl group, can be used.

The matrix material may further comprise highly refractive particles with the binder, if desired. The term "highly refractive particles" may mean particles having a refractive index of 1.5 or more, 2.0 or more, 2.5 or more, 2.6 or more, or 2.7 or more, for example. The upper limit of the refractive index in the highly refractive particles can be selected, for example, within a range that can satisfy the desired refractive index. The highly refractive particles may have an average particle diameter smaller than that of the scattering particles, for example. The highly refractive particles may have an average particle diameter of, for example, 1 nm to 100 nm, 5 nm to 90 nm, 5 nm to 80 nm, 5 nm to 70 nm, 5 nm to 60 nm, 5 nm to 50 nm, or 5 nm to 40 nm or so. As the highly refractive particles, alumina, aluminosilicate, titanium oxide or zirconium oxide, and the like can be exemplified. As the highly refractive particles, for example, rutile titanium oxide, which are particles having a refractive index of 2.5 or more, can be used. The rutile-type titanium oxide has a higher refractive index than other particles, and thus allows to be adjusted to a desired refractive index even at a relatively small ratio.

The ratio of the highly refractive particles in the matrix material is not particularly limited, and can be selected so that the matrix material can exhibit a refractive index in a range described below, for example. In one example, the matrix material may comprise at least 50 parts by weight of highly refractive particles relative to 100 parts by weight of the binder. The ratio of highly refractive particles may be at least 55 parts by weight, at least 60 parts by weight, at least 65 parts by weight, at least 70 parts by weight, at least 75 parts by weight, at least 80 parts by weight, at least 85 parts by weight, at least 90 parts by weight, at least 95 parts by weight, at least 100 parts by weight, at least 105 parts by weight, at least 110 parts by weight, at least 115 parts by weight or at least 120 parts by weight, and at most 250 parts by weight, at most 240 parts by weight, at most 230 parts by weight, at most 220 parts by weight, at most 210 parts by weight, at most 200 parts by weight, at most 190 parts by weight, at most 180 parts by weight, at most 170 parts by weight, at most 160 parts by weight, at most 150 parts by weight, at most 140 parts by weight or at most 130 parts by weight, relative to 100 parts by weight of the binder.

The refractive index of the matrix material in the optical functional layer thus formed, i.e., the refractive index of the portion excluding the scattering particles, may be in the range of, for example, about 1.5 to 1.75, in the range of about 1.55 to 1.75, or in the range of about 1.55 to 1.65, but is not limited thereto.

The above optical functional layer may be formed by a known method, and for example, the optical functional layer may be formed by coating a material by a wet coating method and applying heat or irradiating light, or curing the material by a sol-gel method, or through a deposition method such as a CVD (Chemical Vapor Deposition) or PVD (Physical Vapor Deposition) method, or a nano-imprinting or micro-embossing method, and the like.

The thickness of the optical functional layer is not particularly limited, but may be generally about 150 nm or more. The thickness of the optical functional layer may be, for example, about 2,000 nm or less, about 1,500 nm or less, about 1,000 nm or less, or about 900 nm or less.

In one example, the optical functional layer may have a haze of 60% or more, while having a thickness in the range of 150 nm to 300 nm or about 150 nm to 250 nm. In this case, the haze may be, for example, about 90% or less, 85% or less, 80% or less, 75% or less, 70% or less, or 65% or less. The thickness and haze in such a range can reduce light absorption and moisture absorption by the optical functional layer, thereby enabling stable drive and securing light extraction efficiency.

In one example, the functional layer may be a multi-layer structure formed by including an upper layer and a lower layer. Here, the upper layer and the lower layer may be an upper layer and a lower layer, formed using the same matrix material and scattering particles, and may be an upper layer and a lower layer, formed using other matrix materials and/or other scattering particles.

The upper layer and the lower layer can be classified according to the proportion of the scattering particles contained in the corresponding layer. That is, even in the case of a layer formed using the same matrix material and scattering particles, the layer may be regarded as a multi-layer when a high proportion layer of scattering particles and a low proportion layer coexist in the optical functional layer.

Such a multi-layer structure can be formed by using, for example, two types of materials comprising the same matrix material and scattering particles, as in examples to be described below, but having different scattering particle ratios.

In one example, the number of scattering particles per unit volume of the upper layer may be greater than the number of scattering particles per unit volume of the lower layer.

In this case, the ratio (TL/TU) of the thickness (TL) of the lower layer to the thickness (TU) of the upper layer may be in a range of 1 to 10. In another example, the ratio may be at least 1.5, at least 2, or at least 2.5, and may be at most 9.5, at most 9, at most 8.5, at most 8, at most 7.5, at most 7, at most 6.5, at most 6, at most 5.5, at most 5, at most 4.5, at most 4, at most 3.5 or at most 3.

In the above structure, the performance of the optical functional layer can be maximized.

The electrode layer formed in contact with the irregularities of the optical functional layer in the substrate may be, for example, a hole injecting or electron injecting electrode layer commonly used in a so-called OLED or the like. The electrode layer may be a transparent electrode layer or a reflective electrode layer.

The hole injecting electrode layer can be formed using, for example, a material having a relatively high work function, and can be formed using a transparent or reflective material, if necessary. For example, the hole injecting electrode layer may comprise a metal, an alloy, an electrically conductive compound or a mixture of two or more of the foregoing, which has a work function of about 4.0 eV or more. Such a material can be exemplified by a metal such as gold, an oxide material such as CuI, ITO (indium tin oxide), IZO (indium zinc oxide), ZTO (zinc tin oxide), zinc oxide doped with aluminum or indium, magnesium indium oxide, nickel tungsten oxide, ZnO, $SnO_2$ or $In_2O_3$, a metal nitride such as gallium nitride, a metal serenide such as zinc serenide, a metal sulfide such as zinc sulfide, and the like. The transparent hole injecting electrode layer can also be formed by using a metal thin film of Au, Ag or Cu, and the like and a laminate of a highly refractive transparent material such as ZnS, $TiO_2$ or ITO, and the like.

The hole injecting electrode layer can be formed by any means such as vapor deposition, sputtering, chemical vapor deposition or electrochemical means. In addition, the formed electrode layer may be patterned through a process using known photolithography or shadow mask, and the like, if necessary.

The electron injecting electrode layer can be formed using, for example, a material having a relatively small work function, and for example, can also be formed using a suitable transparent or reflective material of materials used for forming the hole injecting electrode layer, but is not limited thereto. The electron injecting electrode layer can also be formed using, for example, a vapor deposition method or a sputtering method, and can be suitably patterned, if necessary.

In one example, an indium tin oxide layer (ITO layer) may be used as the electrode layer.

The thickness of the electrode layer may be, for example, about 50 nm to 200 nm, 70 nm to 180 nm, or about 70 nm to 150 nm or so, or the electrode layer may be formed to have a thickness of about 70 nm to 100 nm or so.

The present application also relates to an organic electronic device. An exemplary organic electronic device of the present application may comprise a substrate for the organic electronic element as described above; and an element region including an organic layer formed on an electrode layer of the substrate. The organic electronic device may further comprise an electrode layer formed on the organic layer. Hereinafter, for distinction the electrode layer formed on the substrate for an organic electronic element may be referred to as a first electrode layer and the electrode layer formed on the organic layer may be referred to as a second electrode layer.

The organic layer may comprise at least a light emitting layer. For example, if the first electrode layer is embodied transparently and the second electrode layer is a reflective electrode layer, a bottom emitting device can be embodied, in which light generated in the light emitting layer of the organic layer is emitted toward the support base layer through the optical functional layer.

In the case where the organic electronic device is an organic light emitting device, the corresponding device may have: (1) a form of a hole injecting electrode layer/an organic light emitting layer/an electron injecting electrode layer; (2) a form of a hole injecting electrode layer/a hole injecting layer/an organic light emitting layer/an electron injecting electrode layer; (3) a form of a hole injecting electrode layer/an organic light emitting layer/an electron injecting layer/an electron injecting electrode layer; (4) a form of a hole injecting electrode layer/a hole injecting layer/an organic light emitting layer/an electron injecting layer/an electron injecting electrode layer; (5) a form of a hole injecting electrode layer/an organic semiconductor layer/an organic light emitting layer/an electron injecting electrode layer; (6) a form of hole injecting electrode layer/an organic semiconductor layer/an electron barrier layer/an organic light emitting layer/an electron injecting electrode layer; (7) a form of a hole injecting electrode layer/an organic semiconductor layer/an organic light emitting layer/an adhesion improving layer/an electron injecting electrode layer; (8) a form of a hole injecting electrode layer/a hole injecting layer/a hole transporting layer/an organic light emitting layer/an electron injecting layer/an electron injecting electrode layer; (9) a form of a hole injecting electrode layer/an insulating layer/an organic light emitting layer/an insulating layer/an electron injecting electrode layer; (10) a form of a hole injecting electrode layer/an inorganic semiconductor layer/an insulating layer/an organic light emitting layer/an insulating layer/an electron injecting electrode layer; (11) a form of a hole injecting electrode layer/an organic semiconductor layer/an insulating layer/an organic light emitting layer/an insulating layer/an electron injecting electrode layer; (12) a form of a hole injecting electrode layer/an insulating layer/a hole injecting layer/a hole transporting layer/an organic light emitting layer/an insulating layer/an electron injecting electrode layer or (13) a form of a hole injecting electrode layer/an insulating layer/a hole injecting layer/a hole transporting layer/an electron injecting electrode layer, and in some cases, may also have a form comprising an organic layer having a structure in which at least two light emitting layers are divided between the hole injecting electrode layer and the electron injecting electrode layer by an intermediate electrode layer or a charge generating layer (CGL), having charge generation properties, but is not limited thereto.

In this field, various materials for forming the hole or electron injecting electrode layer and the organic layer, for example, the light emitting layer, the electron injecting or transporting layer, the hole injecting or transporting layer, and a forming method thereof are known, and all the above methods can be applied to manufacture the organic electronic devices.

The organic electronic device may further comprise a sealing structure. The sealing structure may be a protective structure that prevents foreign substances such as moisture and oxygen from being introduced into the organic layer of the organic electronic device. The sealing structure may be, for example, a can such as a glass can or a metal can, or may be a film covering the entire surface of the organic layer.

The present application also relates to a use of the organic electronic device, for example, the organic light emitting device. In one example, the present application relates to a light source for a display comprising the organic electronic device. In another example, the present application relates to a lighting apparatus comprising the organic electronic device. The light source for a display can be exemplified by a backlight of a liquid crystal display (LCD), lighting, a light source of various sensors, printers, copy machines, and the like, an automotive gauge light source, a traffic light, a display light, a display device, a light source of sheet illuminants, a display, a decoration or various lights, and the like.

Furthermore, when the organic electronic device is applied to the light source for the display, the illumination device, or other applications, other components constituting the light source for the display or the illumination device, and the construction method thereof are not particularly limited, any material or method known in the corresponding field may be employed as long as the organic electronic device is applied thereto.

Advantageous Effects

The present application provides a substrate, an organic electronic device and a use thereof. The substrate of the present application has a structure comprising an electrode layer directly formed on the corrugated surface of the optical functional layer, and upon having formed an organic electronic device, can secure excellent functionality, for example, light extraction efficiency, and the like, together with stable drive of the element for a long time.

BRIEF DESCRIPTION OF DRAWINGS

FIG. 1 is a diagram of an exemplary substrate. Reference Numeral 101 denotes a support base material, Reference Numeral 102 denotes an optical functional layer, Reference Numeral 103 denotes an electrode layer, and Reference Numeral 104 denotes an organic electronic device.

BEST MODE

Hereinafter, the present application will be described in detail by way of examples and comparative examples, but the scope of the present application is not limited by the following examples.

1. Measurement of Average Roughness (Ra) and 10-Point Average Roughness (Rz)

In Examples, the average roughness (Ra) and the 10-point average roughness were measured by using a WSI (White-Light Scanning Interferometry) mode as 3D Optical Profiler and using a Nano View E1000 product from Nanosystem equipped with a He—Ne laser (633 nm), and identified using the software provided with the Profiler.

2. Measuring Method of Haze

In Examples and Comparative Examples, the haze is a result of evaluation using JIS K 7105 method using HM-150.

Example 1

Preparation of Composition

Polysiloxane (PVMQ, phenyl vinyl methyl siloxane) having a refractive index of about 1.45 to 1.55 as a binder and zirconia particles (highly refractive particles) ($ZrO_2$) having a refractive index of about 2.0 and an average particle diameter of about 7 nm were mixed in a weight ratio of about 45:55 (PVMQ:$ZrO_2$) to prepare a coating composition capable of forming a layer having a refractive index of about 1.6. Subsequently, rutile titanium oxide (rutile $TiO_2$) having a refractive index of about 2.5 and an average particle diameter of about 250 nm as scattering particles was mixed with the mixture (PVMQ+$ZrO_2$) in a weight ratio of about 90:10 (mixture:scattering particles) to prepare a first composition.

After coating the first composition on a glass substrate to a final thickness of about 200 nm, the haze of the optical functional layer formed through the condensation reaction according to a known method was measured and the result was identified to be about 45%.

Also, a composition was prepared in the same manner as above, but the ratio of the mixture to the scattering particles (rutile $TiO_2$) was adjusted to 94:6 (mixture:scattering particles) to prepare a second composition.

After coating the second composition on a glass substrate to a final thickness of about 500 nm, the haze of the optical functional layer formed through the condensation reaction according to a known method was measured and the result was identified to be about 25%.

Manufacture of Substrate and Organic Light Emitting Device

The second composition as prepared above was coated on a glass substrate (refractive index: about 1.5) so as to have a final thickness of about 500 nm, and then subjected to a condensation reaction to form a bottom optical functional layer comprising polysiloxane, highly refractive particles ($ZrO_2$) and scattering particles (rutile $TiO_2$).

Subsequently, the first composition was coated on the bottom optical functional layer so as to have a final thickness of about 200 nm, and then subjected to a condensation reaction to form a top optical functional layer comprising polysiloxane, highly refractive particles ($ZrO_2$) and scattering particles (rutile $TiO_2$) as well.

Figure 2:
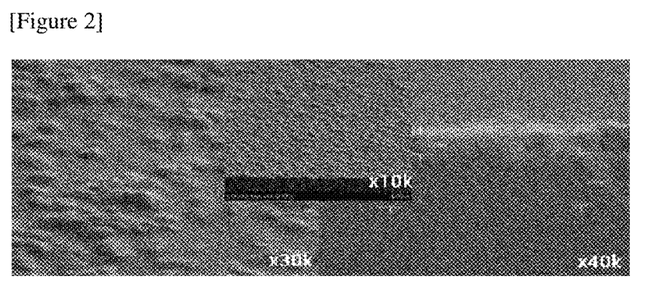
FIG. 2 is a photograph of the corrugated surface produced in an example.

The measured haze of the top and bottom optical functional layers as a whole was about 60%, and the average roughness (Ra) of the surface (top optical functional layer surface) was about 9.61 nm and the 10-point average roughness (Rz) was about 78.93 nm. FIG. 2 is a microphotograph of the top optical functional layer surface measured at magnifications of 10K, 30K and 40K, respectively.

Subsequently, an ITO (Indium Tin Oxide) conductive layer (refractive index: about 2.0) was directly formed on the surface of the top optical functional layer by a known deposition method to a thickness of about 75 nm to manufacture a substrate.

Subsequently, a hole injecting layer, a hole transporting layer, an organic light emitting layer, an electron transporting layer and an electron injecting layer, which are organic layers as materials used for formation of a known white OLED, were sequentially formed on the ITO electrode layer of the substrate and an aluminum electrode layer, which is a reflective electrode, was again formed thereon to form an organic electronic device.

Example 2

Preparation of Composition

A composition was formed in the same manner as in the preparation of composition in Example 1, but the weight ratio (mixture:scattering particles) of the mixture (PVMQ+$ZrO_2$) and the scattering particles (rutile $TiO_2$) was adjusted to about 93:7 to prepare the first composition.

After coating the first composition on a glass substrate to a final thickness of about 200 nm, the haze of the optical functional layer formed through the condensation reaction according to a known method was measured and the result was identified to be about 35%.

Also, a composition was prepared in the same manner as above, but the ratio of the mixture to the scattering particles (rutile $TiO_2$) was adjusted to 97:3 (mixture:scattering particles) to prepare a second composition.

After coating the second composition on a glass substrate to a final thickness of about 500 nm, the haze of the optical functional layer formed through the condensation reaction according to a known method was measured and the result was identified to be about 15%.

Manufacture of Substrate and Organic Light Emitting Device

The second composition as prepared above was coated on a glass substrate (refractive index: about 1.5) so as to have a final thickness of about 500 nm, and then subjected to a condensation reaction to form a bottom optical functional layer comprising polysiloxane, highly refractive particles ($ZrO_2$) and scattering particles (rutile $TiO_2$).

Subsequently, the first composition was coated on the bottom optical functional layer so as to have a final thickness of about 200 nm, and then subjected to a condensation reaction to form a top optical functional layer comprising polysiloxane, highly refractive particles ($ZrO_2$) and scattering particles (rutile $TiO_2$) as well.

The measured haze of the top and bottom optical functional layers as a whole was about 45%, and the average roughness (Ra) of the surface (top optical functional layer surface) was about 7.36 nm and the 10-point average roughness (Rz) was about 70.96 nm.

Subsequently, an ITO (Indium Tin Oxide) electrode layer was directly formed on the surface of the top optical functional layer in the same manner as in Example 1 to manufacture a substrate.

Subsequently, a hole injecting layer, a hole transporting layer, an organic light emitting layer, an electron transporting layer and an electron injecting layer, which are organic layers as materials used for formation of a known white OLED, were sequentially formed on the ITO electrode layer of the substrate and an aluminum electrode layer, which is a reflective electrode, was again formed thereon to form an organic electronic device.

Example 3

Preparation of Composition

A composition was formed in the same manner as in the preparation of composition in Example 1, but the weight ratio (mixture:scattering particles) of the mixture (PVMQ+ $ZrO_2$) and the scattering particles (rutile $TiO_2$) was adjusted to about 80:20 to prepare the first composition.

After coating the first composition on a glass substrate to a final thickness of about 200 nm, the haze of the optical functional layer formed through the condensation reaction according to a known method was measured and the result was identified to be about 60%.

Manufacture of Substrate and Organic Light Emitting Device

The first composition as prepared above was coated on a glass substrate (refractive index: about 1.5) so as to have a final thickness of about 200 nm, and then subjected to a condensation reaction to form an optical functional layer comprising polysiloxane, highly refractive particles ($ZrO_2$) and scattering particles (rutile $TiO_2$).

The measured haze of the optical functional layer was about 60%, and the average roughness (Ra) of the surface (top optical functional layer surface) was about 9.59 nm and the 10-point average roughness (Rz) was about 76.18 nm.

Subsequently, an ITO (Indium Tin Oxide) electrode layer was directly formed on the surface of the top optical functional layer in the same manner as in Example 1 to manufacture a substrate.

Subsequently, a hole injecting layer, a hole transporting layer, an organic light emitting layer, an electron transporting layer and an electron injecting layer, which are organic layers as materials used for formation of a known white OLED, were sequentially formed on the ITO electrode layer of the substrate and an aluminum electrode layer, which is a reflective electrode, was again formed thereon to form an organic electronic device.

Example 4

Preparation of Composition

Polysiloxane (PVMQ, phenyl vinyl methyl siloxane) having a refractive index of about 1.45 to 1.55 as a binder and zirconia particles (highly refractive particles) ($ZrO_2$) having a refractive index of about 2.0 and an average particle diameter of about 7 nm were mixed in a weight ratio of about 45:55 (PVMQ:$ZrO_2$) to prepare a coating composition capable of forming a layer having a refractive index of about 1.6. Subsequently, rutile titanium oxide (rutile $TiO_2$) having a refractive index of about 2.5 and an average particle diameter of about 250 nm as scattering particles was mixed with the mixture (PVMQ+$ZrO_2$) in a weight ratio of about 90:10 (mixture:scattering particles) to prepare a first composition.

After coating the first composition on a glass substrate to a final thickness of about 200 nm, the haze of the optical functional layer formed through the condensation reaction according to a known method was measured and the result was identified to be about 45%.

Also, a second composition was prepared in the same manner as above, except that the scattering particles were not applied thereto.

After coating the second composition on a glass substrate to a final thickness of about 500 nm, the haze of the optical functional layer formed through the condensation reaction according to a known method was measured and the result was identified to be about 0%.

Manufacture of Substrate and Organic Light Emitting Device

The second composition as prepared above was coated on a glass substrate (refractive index: about 1.5) so as to have a final thickness of about 500 nm, and then subjected to a condensation reaction to form a bottom optical functional layer comprising polysiloxane and highly refractive particles ($ZrO_2$).

Subsequently, the first composition was coated on the bottom optical functional layer so as to have a final thickness of about 200 nm, and then subjected to a condensation reaction to form a top optical functional layer comprising polysiloxane, highly refractive particles ($ZrO_2$) and scattering particles (rutile $TiO_2$) as well.

The measured haze of the top and bottom optical functional layers as a whole was about 47%, and the average roughness (Ra) of the surface (top optical functional layer surface) was about 7.46 nm and the 10-point average roughness (Rz) was about 66.58 nm.

Subsequently, an ITO (Indium Tin Oxide) electrode layer was directly formed on the surface of the top optical functional layer in the same manner as in Example 1 to manufacture a substrate.

Subsequently, a hole injecting layer, a hole transporting layer, an organic light emitting layer, an electron transporting layer and an electron injecting layer, which are organic layers as materials used for formation of a known white OLED, were sequentially formed on the ITO electrode layer of the substrate and an aluminum electrode layer, which is a reflective electrode, was again formed thereon to form an organic electronic device.

Example 5

Preparation of Composition

A composition was formed in the same manner as in the preparation of composition in Example 1, but the weight ratio (mixture:scattering particles) of the mixture (PVMQ+ $ZrO_2$) and the scattering particles (rutile $TiO_2$) was adjusted to about 85:15 to prepare the first composition.

After coating the first composition on a glass substrate to a final thickness of about 200 nm, the haze of the optical functional layer formed through the condensation reaction according to a known method was measured and the result was identified to be about 50%.

Also, a composition was prepared in the same manner as above, but the ratio of the mixture to the scattering particles (rutile $TiO_2$) was adjusted to 97:3 (mixture:scattering particles) to prepare a second composition.

After coating the second composition on a glass substrate to a final thickness of about 500 nm, the haze of the optical functional layer formed through the condensation reaction according to a known method was measured and the result was identified to be about 15%.

Manufacture of Substrate and Organic Light Emitting Device

The second composition as prepared above was coated on a glass substrate (refractive index: about 1.5) so as to have a final thickness of about 500 nm, and then subjected to a condensation reaction to form a bottom optical functional layer comprising polysiloxane, highly refractive particles ($ZrO_2$) and scattering particles (rutile $TiO_2$).

Subsequently, the first composition was coated on the bottom optical functional layer so as to have a final thickness of about 200 nm, and then subjected to a condensation reaction to form a top optical functional layer comprising polysiloxane, highly refractive particles ($ZrO_2$) and scattering particles (rutile $TiO_2$) as well.

The measured haze of the top and bottom optical functional layers as a whole was about 60%, and the average roughness (Ra) of the surface (top optical functional layer surface) was about 9.24 nm and the 10-point average roughness (Rz) was about 80.38 nm.

Subsequently, an ITO (Indium Tin Oxide) electrode layer was directly formed on the surface of the top optical functional layer in the same manner as in Example 1 to manufacture a substrate.

Subsequently, a hole injecting layer, a hole transporting layer, an organic light emitting layer, an electron transporting layer and an electron injecting layer, which are organic layers as materials used for formation of a known white OLED, were sequentially formed on the ITO electrode layer of the substrate and an aluminum electrode layer, which is a reflective electrode, was again formed thereon to form an organic electronic device.

Comparative Example 1

Preparation of Composition

Polysiloxane (PVMQ, phenyl vinyl methyl siloxane) having a refractive index of about 1.45 to 1.55 as a binder and zirconia particles (highly refractive particles) ($ZrO_2$) having a refractive index of about 2.0 and an average particle diameter of about 7 nm were mixed in a weight ratio of about 45:55 (PVMQ:$ZrO_2$) to prepare a coating composition (a first composition) capable of forming a layer having a refractive index of about 1.6.

Also, a mixture (PVMQ+$ZnO_2$) prepared in the same manner as above and scattering particles (rutile titanium oxide (rutile $TiO_2$) having a refractive index of about 2.5 and an average particle diameter of about 250 nm) were adjust in a weight ratio of about 94:6 (mixture:scattering particles) to prepare a second composition.

After coating the second composition on a glass substrate to a final thickness of about 500 nm, the haze of the optical functional layer formed through the condensation reaction according to a known method was measured and the result was identified to be about 25%.

Manufacture of Substrate and Organic Light Emitting Device

The second composition as prepared above was coated on a glass substrate (refractive index: about 1.5) so as to have a final thickness of about 500 nm, and then subjected to a condensation reaction to form a bottom optical functional layer comprising polysiloxane, highly refractive particles ($ZrO_2$) and scattering particles (rutile $TiO_2$).

Subsequently, the first composition was coated on the bottom optical functional layer so as to have a final thickness of about 200 nm, and then subjected to a condensation reaction to form a top optical functional layer comprising polysiloxane and highly refractive particles ($ZrO_2$).

The measured haze of the top and bottom optical functional layers as a whole was about 25%, and the average roughness (Ra) of the surface (top optical functional layer surface) was about 2.08 nm and the 10-point average roughness (Rz) was about 27.52 nm.

Subsequently, an ITO (Indium Tin Oxide) electrode layer (refractive index: about 2.0) was directly formed on the surface of the top optical functional layer by a known deposition method to a thickness of about 75 nm to manufacture a substrate.

Subsequently, a hole injecting layer, a hole transporting layer, an organic light emitting layer, an electron transporting layer and an electron injecting layer, which are organic layers as materials used for formation of a known white OLED, were sequentially formed on the ITO electrode layer of the substrate and an aluminum electrode layer, which is a reflective electrode, was again formed thereon to form an organic electronic device.

Comparative Example 2

A substrate was manufactured in the same manner as in Example 3, but a highly refractive flat layer (refractive index of about 1.72) made of a known material was formed without forming an ITO electrode layer directly on the optical functional layer, and then an ITO electrode layer was formed to prepare the substrate, and the organic electronic device was produced equally.

While organic electronic devices of Examples and Comparative Examples above were driven under a condition of 3 mA/cm2, each of P.E (luminescent efficiency) (unit: lm/W) and Q.E. (quantum efficiency) (unit: %) was measured and the results were summarized and described in Table 1 below.

TABLE 1

|  | Example | | | | | Comparative Example | |
| --- | --- | --- | --- | --- | --- | --- | --- |
|  | 1 | 2 | 3 | 4 | 5 | 1 | 2 |
| Q.E. | 60.4 | 59.2 | 57.6 | 58.6 | 58.5 | 56.2 | 55.7 |
| P.E. | 68 | 69 | 50.7 | 67 | 68 | 65 | 49.3 |

The invention claimed is:
1. A substrate comprising a support base layer; an optical functional layer formed on the support base layer; and an electrode layer formed on the optical functional layer, wherein the surface of the optical functional layer opposite to the support base layer is a corrugated surface having an average roughness (Ra) of 5 nm or more and a 10-point average roughness (Rz) of 30 nm or more,
the optical functional layer comprises scattering particles and a binder, and
the electrode layer is formed in contact with the corrugated surface of the optical functional layer.

2. The substrate according to claim 1, wherein no flat layer is present between the optical functional layer and the electrode layer.

3. The substrate according to claim 1, wherein the optical functional layer is a light-scattering layer.

4. The substrate according to claim 1, wherein the optical functional layer has a haze of 20% or more.

5. The substrate according to claim 1, wherein the optical functional layer has a thickness of 150 nm or more.

6. The substrate according to claim 1, wherein the optical functional layer has a thickness in a range of 150 nm to 300 nm and a haze of 60% or more.

7. The substrate according to claim 1, wherein the optical functional layer is formed to include an upper layer and a lower layer.

8. The substrate according to claim 7, wherein the ratio (TL/TU) of the thickness (TL) of the lower layer to the thickness (TU) of the upper layer is in a range of 1 to 10.

9. The substrate according to claim 7, wherein the number of scattering particles per unit volume of the upper layer is greater than the number of scattering particles per unit volume of the lower layer.

10. The substrate according to claim 1, wherein the optical functional layer further comprises a matrix material having a refractive index in a range of 1.5 to 1.75 for light having a wavelength of 550 nm.

11. The substrate according to claim 10, wherein the matrix material comprises a binder having a refractive index in a range of 1.4 to 1.65 for light having a wavelength of 550 nm and highly refractive particles having a refractive index of at least 1.5 for light having a wavelength of 550 nm.

12. The substrate according to claim 11, wherein the matrix material comprises 50 parts by weight or more of highly refractive particles relative to 100 parts by weight of the binder.

13. The substrate according to claim 1, wherein the electrode layer is an indium tin oxide layer.

14. An organic electronic device comprising: the substrate of claim 1; and an element region having an organic layer present on the electrode layer of said substrate.

15. A light source for a display comprising the organic electronic device of claim 14.

16. A lighting apparatus comprising the organic electronic device of claim 14.

* * * * *